US005760640A

United States Patent [19]
Girard et al.

[11] Patent Number: 5,760,640
[45] Date of Patent: Jun. 2, 1998

[54] HIGHLY SYMMETRICAL BI-DIRECTION CURRENT SOURCES

[75] Inventors: Phillipe Girard, Essones; Patrick Mone, Ponthierry, both of France

[73] Assignee: International Business Machines Corporation, Armonk, N.Y.

[21] Appl. No.: 758,334

[22] Filed: Dec. 3, 1996

[30] Foreign Application Priority Data

Jun. 12, 1995 [EP] European Pat. Off. ............ 95480171

[51] Int. Cl.⁶ ...................................................... G05F 1/10
[52] U.S. Cl. ............................ 327/543; 327/530; 327/538
[58] Field of Search .................................... 323/312, 315, 323/316; 327/530, 538, 542, 543

[56] References Cited

U.S. PATENT DOCUMENTS 5,212,458  5/1993  Fitzpatrick et al. ............... 330/228
5,266,887  11/1993  Smith ................................. 323/316

OTHER PUBLICATIONS

IEEE Journal of Solid–State Circuts, vol. 27, No. 11, 1 Nov. 1992, pp. 1599–1606, XP000320789, Young, I.A. et al "A PLL Clock Generator with 5 to 110 MHz of Lock Range for Microprocessors".

Proceedings of the Customer Integrated Circutis Conference, Boston, May 3–6, 1992, No. Conf. 14, 3 May 1992, Institute of Electrical and Electornics Engineers, pp. 24.3.1–14.3.5 Huehne, K. et al "A Single–Chip, 1.2 GHz, PLL Frequency Synthesizer Using Reduced Capacitance, Dual Gate, BICMOS Tehcnology".

*Primary Examiner*—Toan Tran
*Assistant Examiner*—Jeffrey Zweizig
*Attorney, Agent, or Firm*—Steven B. Phillips

[57] ABSTRACT

A bi-directional current source which maintains accurate, substantially equal source and sink currents over a large range of output voltages. The current source includes a primary field effect transistor (FET) and two mirroring FET's. It additionally includes at least one operational amplifier for voltage balancing. An optional operational amplifier provides and additional bias voltage and transistor matching optionally provides impedance matching of the supply voltages.

4 Claims, 3 Drawing Sheets

HIGHLY SYMMETRICAL BI-DIRECTION CURRENT SOURCES

BACKGROUND OF THE INVENTION

1. Field of Invention The present invention generally relates to current sources and more particularly to highly symmetrical bi-directional current sources. Source and sink currents having accurately the same value (substantially equal to a determined reference current) are obtained over a large range of the output voltage thanks to circuit improvements implemented in the current generator portion of a bi-directional current source.

2. Prior Art

FIG. 1 shows the typical implementation of a conventional bi-directional current source biased between first and second supply voltages, referred to hereinbelow as Vdd and the ground Gnd respectively. The bi-directional current source referenced 10 is basically comprised of two elementary circuits: a bi-directional current generator 11 and a switching circuit 12. The latter is described in the article: "A PLL Clock Generator with 5 to 110 MHz of Lock Range for Microprocessors", published in the IEEE ISCC, vol. 27, No 11, November 92. The bi-directional current generator 11 is comprised of a current supply 13 which generates a reference current labelled Iref and five FET devices T1 to T5. The reference current Iref is generated by any known circuit means such as including a band-gap reference, a MOS threshold voltage or an external resistor. A first current mirror circuit comprised of PFET devices T1 and T2 mirrors the reference current Iref to determine the source current I+ on PFET device T2 drain such as I+=Iref. A second current mirror circuit comprised of FET devices T1, T3, T4 and T5 mirrors the reference current Iref to determine the sink current I− on NFET device T5 drain so that I−=Iref. Note that diode-connected PFET device T1 transforms the reference current Iref into a reference voltage Vrefp that biases the gate of PFET device T2. In turn, NFET device T3 and diode-connected NFET T4 generate a reference voltage Vrefn which biases the gate of NFET device T5. PFET device T2 and NFET device T5 will be referred to hereafter as the first and second output devices. PFET devices T1 which is common to both current mirror circuits will be referred to as the primary device. FET devices T3 and T4 will be referred to as the first and second mirroring devices respectively.

Switching circuit 12 is comprised of two complementary FET devices T6 and T7 connected in series in a first sub-branch with a first node 14 in between and of two complementary FET devices T8 and T9 connected in series in a second sub-branch with second node 15 in between. These two pairs of complementary FET devices that are connected in parallel and coupled to the drains of PFET device T2 and NFET device T5 at third and fourth nodes 16 and 17 respectively. An operational amplifier OP1 is connected between the first node 14 formed by the drains of FET devices T6 and T7 and the second node 15 formed by the drains of FET devices T8 and T9. The purpose of opamp OP1 (its gain is equal to one) is to maintain the same potential on node 14 (referred to hereafter as the output node) and node 15. Two control signals Vup and Vdn are used to switch either the source current I+ or the sink current I− as the output current Iout at output node 14. These signals Vup and Vdn are applied on adequate gates of the two pairs of complementary FET devices forming switching circuit 12 as illustrated in FIG. 1. For instance, when signal Vup+ is low and signal Vdn+ is high, Iout=I−. Note that signals Vup and Vdn cannot be high at the same time. The output voltage Vout is the potential difference between the output node 14 and the ground Gnd. Current supply 13 and PFET device T1 on the one hand and FET devices T3 and T4 on the other hand form the first and second branches of current source 10 respectively. The output FET devices T2 and T5 of the current generator 11 and paralleled FET devices T6/T7 and T8/T9 of switching circuit 12 form a third branch of current source 10 referred to as the output branch.

The bi-directional current source 10 depicted in FIG. 1 has some drawbacks. In essence, the source and sink currents generated by the current source 10 at the output node 14 are not equal to the reference current Iref and moreover they have different values over the whole operating range of the output voltage Vout. If we disregard the mismatch existing between FET devices T1 and T5 inherent to the manufacturing process for sake of simplicity, the major reasons for these discrepancies are described as follows. The source current I+ is different from Iref because the diode-connected PFET device T1 and PFET device T2 do not have the same drain potential. PFET device T1 has a drain potential near Vdd while PFET device T2 has a drain potential near Gnd. Moreover, this effect is strongly dependent on the first supply voltage Vdd. Likewise, this current depends on the output voltage Vout. On the other hand, the sink current I− flowing in NFET device T7 is different from the current through NFET device T4 (which is already different from Iref) because of the drain potential difference existing in between. Similarly, this current depends on the output voltage Vout. All these potential differences explain why the source and the sink currents are different from each other and different from the reference current Iref and why this effect is strongly dependent of the output voltage Vout.

FIG. 2 shows a plot of the source and sink currents I+ and I− (in µA) at the output node 14 of the bi-directional current source 10 versus the output voltage Vout (in Volts) with Vdd=3.3 V and Iref =50 µA. As apparent from FIG. 2, these voltages currents are the same for only one output voltage Vout approximately equal to 1.2 V and only for that value we have I+=I−=Iref. In addition, it is clear that these source and sink currents exhibit a high dissymmetry. For instance, in region III, current I+ decreases very quickly to zero while sink current I− is rather constant. This is due to the fact that in region III, PFET devices T2 and T6 enter their linear region while NFET devices T5 and T7 are in their saturated region.

OBJECTS OF THE INVENTION

Therefore, it is a main object of the present invention to provide highly symmetrical bi-directional current sources that generate source and sink currents that are equal and accurately equal to a determined reference current substantially over the whole output voltage range.

It is another object of the present invention to provide highly symmetrical bi-directional current sources wherein the potential differences between FET devices and the strong output voltage dependency which exist in conventional bi-directional current sources are eliminated.

It is still another object of the present invention to provide highly symmetrical bi-directional current sources wherein all the impedances of all paths between the first and second supply voltages are equal whatever the branch for excellent impedance matching.

SUMMARY OF THE INVENTION

Therefore, according to the present invention, there is described a highly symmetrical bi-directional current source that achieves a total equality between the source and sink currents substantially over the whole output voltage range. Moreover, these source and sink currents are made equal to a reference current with a high accuracy. In essence, improvements are provided to the current generator portion of a state of the art bi-directional current source having three branches biased between first and second supply voltages. The first branch consists of a diode-connected primary PFET device and a current supply generating a reference current that are connected in series. According to a first feature of the present invention, the second branch is formed by a first mirroring PFET device whose gate is connected to the gate of said primary PFET device, first and second resistively-connected complementary FET devices with an intermediate node coupled therebetween and a second mirroring NFET device that are all connected in series. The third or output branch is formed by first and second output devices with a switching circuit connected in between. The source of the first output device is connected to said first supply voltage and its gate is connected to the gate of said primary device to replicate the reference current on its drain where the source current is generated. The source of the second output device is connected to said second supply voltage and its gate is connected to the gate of said second mirroring device to replicate the reference current on its drain where the sink current is generated. Typically, the switching circuit consists of two pairs of complementary FET devices that are paralleled with a unity gain operational amplifier connected between their common nodes for potential balancing of their common nodes. This switching circuit is connected between the drains of said first and second output devices to select either the source or the sink current as the output current. By adequately designing the size of FET devices in the second and output branches that now include the same number of FET devices, an excellent impedance match between can be obtained. In addition, according to a second feature of the present invention, an operational amplifier based circuit is connected to have its first input connected to one (not the output node) of said common nodes formed by said pairs of paralleled FET devices, its second input is connected to said intermediate node and its output is connected to the common node formed by the gates of said second output and second mirroring devices so that there is no potential difference between its inputs.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION OF PREFERRED EMBODIMENTS

Figure 3:
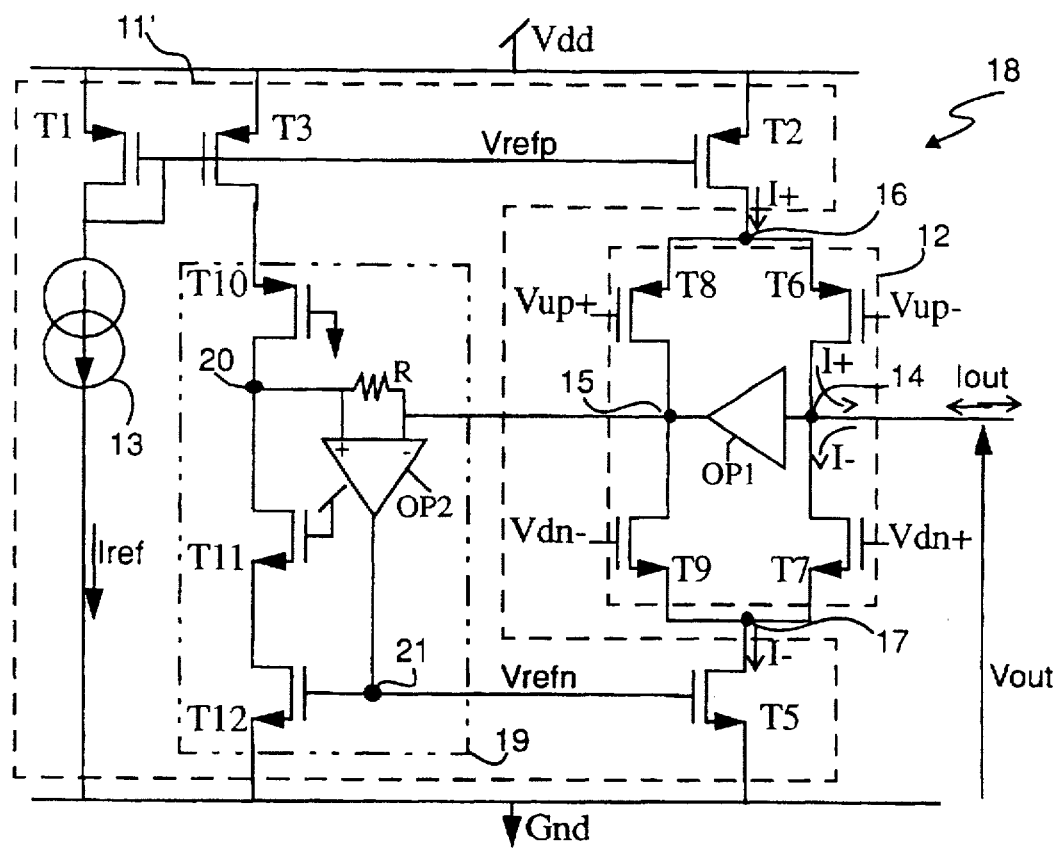
FIG. 3 shows a bi-directional current source with an improvement in the current generator portion according to the teachings of the present invention.

FIG. 3 shows a first circuit 18 which will bring a much higher symmetry between the values of the source and sink currents in the novel bi-directional current source of the present invention. With respect to the current source 10 of FIG. 1, the major change lies in the implementation of circuit 19 in the current generator portion that is referenced 11' in FIG. 3. In essence, the role of circuit 19 is twofold. Firstly, it is designed to ensure a perfect impedance matching between the second branch and the output branch (irrespective of the sub-branch), i.e. whatever the branch, the impedance between the first and second supply voltages is the same. Secondly, it includes an operational amplifier based circuit for potential balancing. In FIG. 3, the other elements already referenced in FIG. 1 bear the same numerals.

Now turning to FIG. 3, in the second branch where NFET device T4 has been removed, FET devices T10, T11 and T12 have been added in series between the drain of first mirroring PFET device T3 and the ground Gnd. FET devices T10 and T11 are resistively-connected complementary devices. NFET device T12 partially plays the role of NFET device T4 in that it is part of the mirroring circuit to bias the second output device T5 (but note that it is not a diode-connected device as was NFET device T4). For that reason, NFET device T12 will be referred to hereafter as the second mirroring device. To fully meet the above mentioned impedance matching needs, FET devices T3, T10/T11 and T12 have the same sizes as corresponding FET devices T2, T6/T8 or T7/T9 and T5 respectively. This construction also provides the same bias voltages when these FET devices are conducting because they are resistively-connected, i.e. the ground Gnd is permanently applied on PFET device T10 gate and supply voltage Vdd is permanently applied on NFET device T11 gate. As a result, the impedance from Vdd to Gnd is the same either along the second branch comprised of FET devices T3, T10, T11 and T12 or along the output branch comprised of FET devices T2, T6/T8 or T7/T9 and T5.

The other improvement consists of optimizing some node potentials. To that end, circuit 19 depicted in FIG. 3, includes a second operational amplifier OP2 and a resistor R connected between its positive and negative inputs. A short connection made between a common node formed by one end of the resistor R and the positive input of opamp OP2 is tied to the common node 20 formed by the drains of FET devices T10 and T11. This common node 20 in the second branch, referred to as the intermediate node, is selected to offer the maximum symmetry with the output node 14 of the output branch (and node 15 as well). In addition, the output terminal of opamp OP2 is connected to the common node 21 formed by the gates of NFET devices T5 and T12. Finally, there is a short connection between the common node formed by the other end of the resistor R which is tied to the negative input of opamp OP2 and second node 15. The role of opamp OP2 and resistor R is to impose a same potential on the common drain of FET devices T10 and T11, on the common drain of FET devices T8 and T9 and thus on the common drain of FET devices T6 and T7 that is equal to the output voltage Vout. To that end, its output is connected to the common node formed by the gates of NFET devices T12 and T5, so that the difference between the currents flowing in FET devices T10 and T11 (sensed by resistor R) is cancelled. The potentials at nodes 14, 15, and 20 are the same when the current in resistor R is equal to zero that is the current flowing in PFET device T10 is equal to the current flowing in NFET device T11. In addition, the bias voltage Vrefn of the NFET devices T12 and T5 is no longer generated by the diode-connected NFET device T4 of FIG. 1, highly sensitive to its drain potential, but by the combination of NFET device T12 and operational amplifier OP2 whose feed-back loop allows a larger control range which extends the sink current dynamic range. As a final result, all nodes 14, 15 and 20 are the middle of a branch comprised of four FET devices and are at the same potential.

The sensing resistor R can be best implemented with a complementary FET device pair and does not require a high precision. There is no stringent requirement on opamp OP2 except that its input common mode range should be equal to the output voltage Vout range and that it should have a high input impedance. This is easily achieved in any analog or digital CMOS technology. It should be noted that the offset current generated by opamp OP2 should be very low: a 10 mV offset voltage with a 10 kΩ resistance built from a complementary pair of FET devices would induce a 0.1 µA offset current between the drain currents of FET devices T10 and T11.

Figure 4:
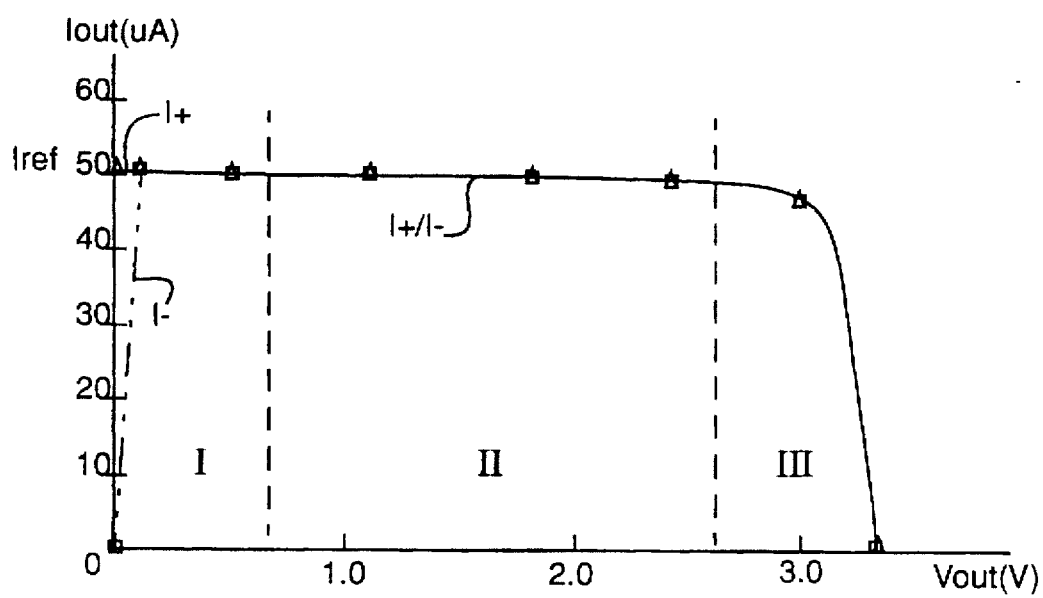
FIG. 4 shows simulation curves demonstrating that a higher symmetry between the source and sink currents is obtained when the novel bi-directional current source of FIG. 3 is used.

Although, current source 18 is more symmetrical than current source 10, the source and sink currents are not exactly equal to Iref over the whole operating range of the output voltage Vout because the drain potential of PFET devices T1 and T2 are not the same as it will be now made more apparent from FIG. 4. Turning to FIG. 4, there is shown the results of the simulation for the output current Iout generated by current source 18 of FIG. 3 with the same equivalent conditions as those used to the curves of FIG. 2. The source and sink currents are now equal for nearly all the output voltage Vout range. Note that for the sink current I−, its dynamic range is extended to a lower voltage (about 0.1 V) because opamp OP2 can raise the NFET reference voltage Vrefn to a higher voltage than for the current source 10 of FIG. 1. As apparent from the curves depicted in FIG. 4, the source and sink currents are now equal and further equal to Iref above said value of about 0.1 V to demonstrate that a significant improvement has been obtained in terms of symmetry.

Figure 5:
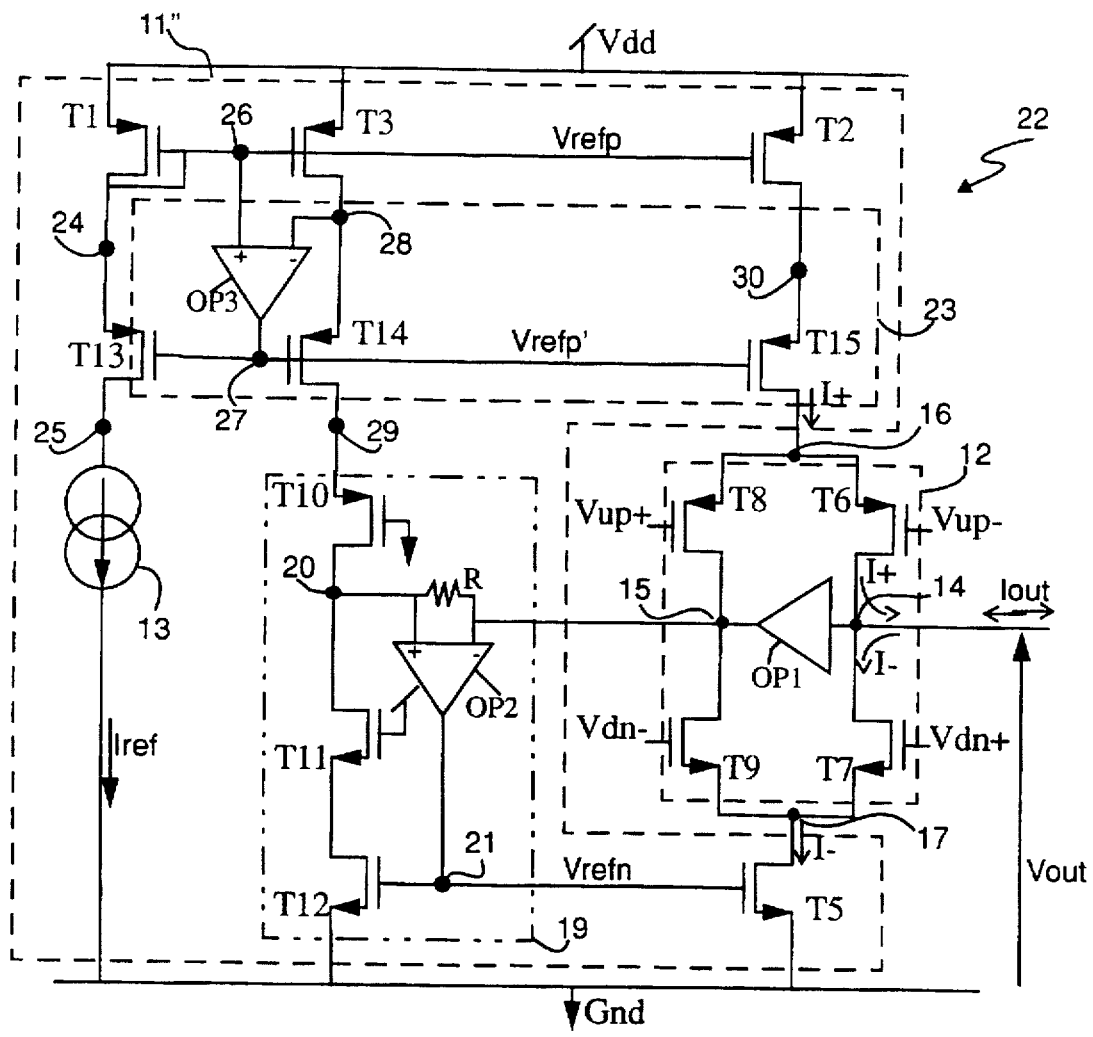
FIG. 5 shows a bidirectional current source with another improvement that can be also implemented in the current generator portion to further reduce the dependency of the source and sink currents versus the output voltage.

Source and sink currents can be made equal to the reference current Iref substantially over the totality of the output voltage Vout range, i.e. practically from 0 V to Vdd thanks to a second circuit improvement still in the current generator portion 11' of current source 18 of FIG. 3. The further improved current source and its current generator portion are referenced 22 and 11" in FIG. 5 respectively. As apparent from FIG. 5, the novel circuit referenced is comprised of a third operational amplifier OP3 and FET devices T13, T14 and T15 that have the same size. A PFET device T13 is connected in series between the drain of diode-connected primary PFET device T1 at node 24 and the current supply 13. The common node between the drain of PFET device T13 and the current source 13 is referenced 25. The positive input of opamp OP3 is connected to be formed by the gates of FET devices T1, T2 and T3 at common node 26. The output of opamp OP3 is connected to the gates of PFET devices T13, T14 and T15 at common node 27. FET device 14 is interposed in series between PFET devices T3 and T10. The negative input of opamp OP3 is connected to the drain of PFET device T3 and the source of PFET device T14 at node 28. The common node formed by the drain of PFET device T14 and the source of FET device T10 is referenced 29. Finally, PFET device T15 is connected in series between the drain of PFET device T2 at node 30 and the said third node 16. The gates of PFET devices T13, T14 and T15 are biased by the Vrefp' voltage generated by opamp OP3. In essence, the role of circuit 23 is to have the drain potentials of PFET devices T2 and T3 exactly the same as the drain potential of PFET device T1. To that end, the feedback loop of opamp OP3 controls the gate potentials of PFET devices T13, T14 and T15 as illustrated in FIG. 5. As a final result, nodes 24, 28 and 30 together and nodes 25, 29 and 16 together are at a same potential. In addition, there is a perfect impedance matching between the different paths from Vdd to Gnd whatever the branch.

Figure 6:
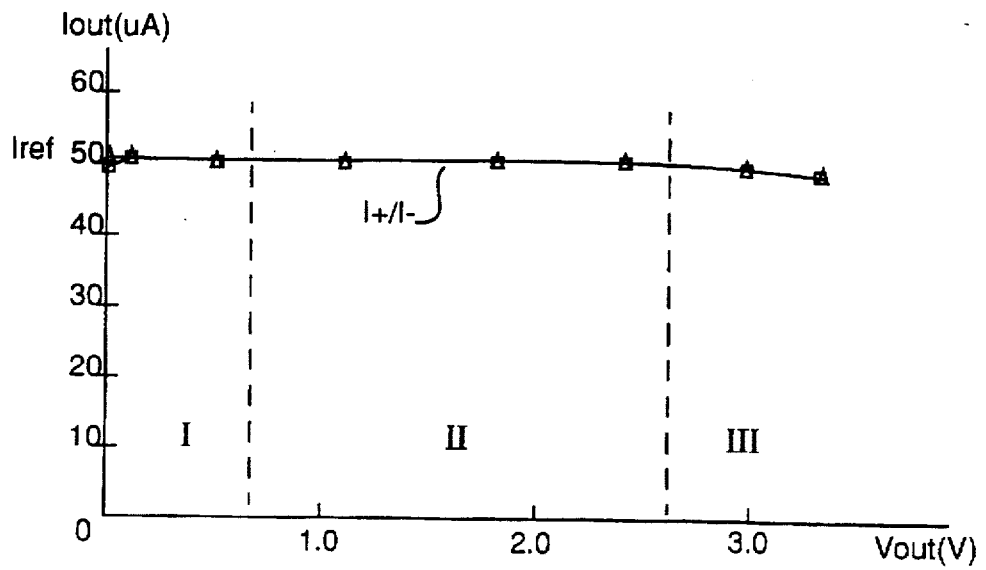
FIG. 6 shows simulation curves demonstrating that the source and sink currents are now equal and equal to the reference current over the whole output voltage range when the highly symmetrical bi-directional current source of FIG. 5 is used.

FIG. 6 shows the plot of the source and sink currents versus the output voltage Vout when the improved current source of FIG. 5 is used (still with Vdd=3.3 V). The output current Iout is quite constant over the 0 to 3 V range and is equal to Iref=50 µA. On the other hand, perfect symmetry between the source and sink currents may be noticed.

Figure 1:
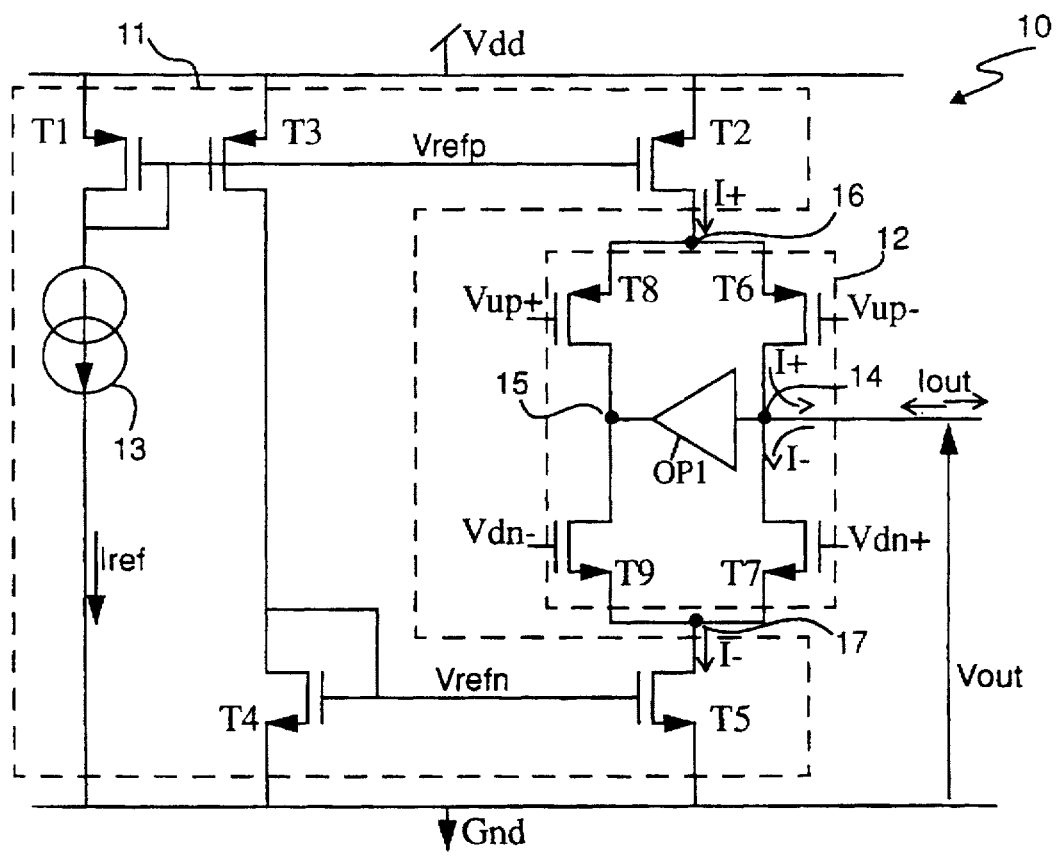
FIG. 1 shows a conventional bi-directional current source which delivers source and sink currents that are not equal and not equal to the reference current.
Figure 2:
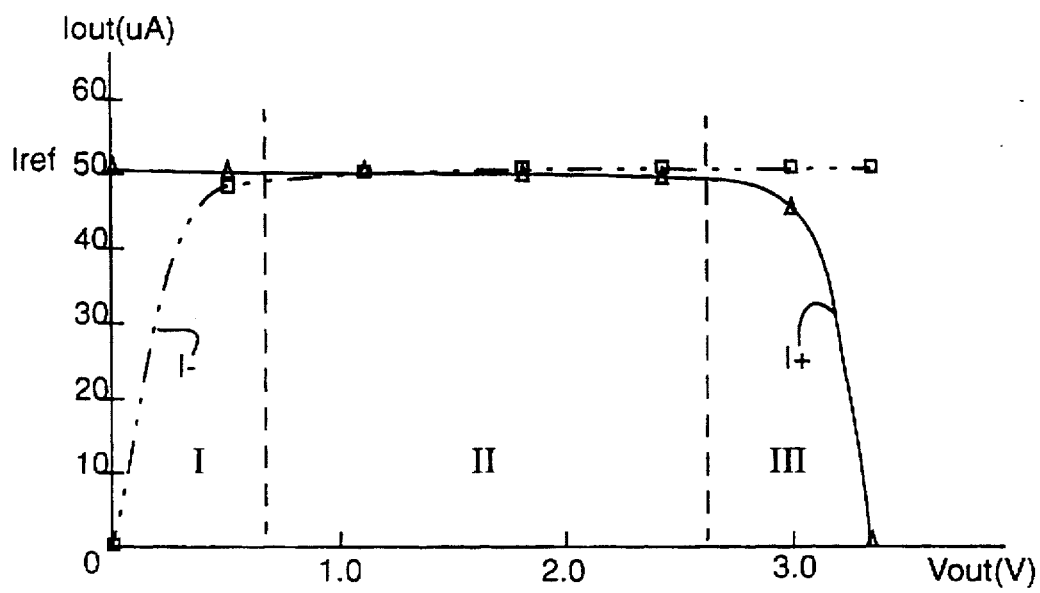
FIG. 2 shows simulation curves illustrating the dissymmetry between the source and sink currents and their strong dependency on the output voltage when the current source of FIG. 1 is used.

The following table shows the variations of the output current Iout (in percent) that result from a comparison between the current sources 10 of FIG. 1 and 22 of FIG. 5. The figures are given for a conventional submicronic CMOS manufacturing process still with Vdd =3.3 V. Supply voltage Vdd varies from 3 to 3.6 V and the temperature varies from 20 to 100 degrees Celsius temperature range (the output voltage Vout is equal to 1.65 V).

TABLE

| Parameter | Circuit 10 FIG. 1 | Circuit 22 FIG. 5 |
| --- | --- | --- |
| Iout (source current) variation | 2.3 | 1.5E-5 |
| Iout (sink current) variation | 3.1 | 7.2E-5 |
| Iout (source current)/Iref variation vs power supply | 1.7 | 2.5E-4 |
| Iout (sink current)/Iref variation vs power supply | 1.6 | 6.3E-3 |
| Isource/Iref variation vs temperature | 1.4 | 3.9E-3 |
| Isink/Iref variation vs temperature | 4.5 | 1.9E-2 |

The bi-directional current sources of the present invention have some definite advantages. The output current accurately replicates the reference current with a high symmetry and over the whole output voltage range. The novel highly symmetrical bi-directional current sources described by reference to FIGS. 3 and 5 relate to a particular type of current sources such those that are widely used in charge pump Phase Locked-Loop oscillators (PLL) but they could work with any other circuits where symmetric source and sink currents are needed such as in digital to analog converters, operational amplifiers, . . . and the like.

We claim:

1. A bi-directional current source biased between a first supply voltage and a second supply voltage comprising:

a current generator connected between the first supply voltage and the second supply voltage, the current generator including a first branch having a primary field effect transistor (FET) and a current supply for generating a reference current, the current generator also including a second branch having first and second mirroring FET's and first and second complimentary FET's and a third branch having first and second output FET's;

a switching circuit for selecting either source or sink current to be output by the bi-directional current source; and a first operational amplifier having inputs connected to the first and second complimentary FET's and the switching circuit and an output connected to the second mirroring FET and the second output FET.

2. The bi-directional current source of claim 1 further comprising:

a first p-channel FET disposed between the primary FET and the current supply;

a second p-channel FET disposed between the first mirroring FET and the first complementary FET; and a second operational amplifier having inputs connected to the primary FET and first mirroring FET and an output connected to the first and second p-channel FET's.

3. The bi-directional current source of claim 1 wherein the FET's in each branch are substantially identical so that an impedance match is obtained between the first and second supply voltages.

4. The bi-directional current source of claim 2 wherein the FET's in each branch are substantially identical so that an impedance match is obtained between the first and second supply voltages.

* * * * *